United States Patent

Klass et al.

[11] Patent Number: 5,825,224
[45] Date of Patent: Oct. 20, 1998

[54] EDGE-TRIGGERED DUAL-RAIL DYNAMIC FLIP-FLOP WITH SELF-SHUT-OFF MECHANISM

[75] Inventors: Edgardo F. Klass, Palo Alto; David W. Poole, Mountain View; Chaim Amir, Sunnyvale; Raymond A. Heald, Los Altos, all of Calif.

[73] Assignee: Sun Microsystems, Inc., Mountain View, Calif.

[21] Appl. No.: 688,057

[22] Filed: Jul. 29, 1996

[51] Int. Cl.[6] ................................................ H03K 3/37
[52] U.S. Cl. .......................... 327/200; 327/208; 327/218
[58] Field of Search .................................... 327/200, 208, 327/218

[56] References Cited

U.S. PATENT DOCUMENTS

| 4,843,264 | 6/1989 | Galbraith | 327/55 |
| 5,497,115 | 3/1996 | Millar et al. | 327/208 |
| 5,633,606 | 5/1997 | Gaudet et al. | 327/208 |
| 5,642,061 | 6/1997 | Gorny | 326/97 |

OTHER PUBLICATIONS

Gaddis, N.B. et al., "A 56–Entry Instruction Reorder Buffer", *1996 IEEE International Solid–State Circuits Conference*, pp. 212–213, (1996), No Month.

Partovi, H. et al., "Flow–Through Latch and Edge–Triggered Flip–Flop Hybrid Elements", *ISSCC Slide Supplement*, p. 104, (1996), No Month.

Shoji, Masakazu, *CMOS Digital Circuit Technology*, Prentice Hall, NJ, pp. 216–217, (1988), No Month.

*Primary Examiner*—Margaret Rose Wambach
*Attorney, Agent, or Firm*—Skjerven, Morrill, MacPherson, Franklin & Friel LLP; Lawrence E. Lycke

[57] ABSTRACT

A dynamic flip-flop includes a first input latch coupled to receive a data input signal and a second input latch coupled to receive the complement of the data put signal. The first and second input latches have first and second shutoff circuits, respectively. During a precharge phase, the first and second input latches each provide an output signal of a first logic level. During an evaluation phase, the first and second input latches sample the data input signal and complemented data input signal, respectively. In response to the samples of true and the complement of the data input signal, one input latch's output signal will transition to a second logic level, while the other input latch's output signal will remain at the first logic level. A first output latch and a second output latch are coupled to receive the output signals of the first and second input latches, respectively. The first and second output latches are inverting. During the precharge phase, the flip-flop provides output signals of the second logic level from both of the output latches. During the evaluation phase, one output latch will continue to provide an output signal of the second logic level and the other output latch will provide an output signal that transitions from the second logic level to the first logic level.

20 Claims, 3 Drawing Sheets

EDGE-TRIGGERED DUAL-RAIL DYNAMIC FLIP-FLOP WITH SELF-SHUT-OFF MECHANISM

FIELD OF THE INVENTION

The present invention relates to digital circuits and, more particularly, to flip-flops. Still more particularly, the present invention relates to a class of flip-flops referred to herein as dynamic flip-flops.

BACKGROUND

Many high performance circuits such as for example, microprocessors, use dynamic logic gates. Dynamic gates generally have shorter delays than conventional static logic gates, which allow the high performance circuit to be faster. Typically, dynamic gates have a precharge phase and an evaluation phase. To ensure correct operation, typical dynamic logic gates require that the input signal received by a dynamic gate must either: (a) be stable before the beginning of the evaluation phase; or (b) transition in only one predetermined direction during the evaluation phase. For example, the dynamic logic gate may require that during the precharge phase, the input signal be at a low voltage level and, thus, only low-to high transitions are allowed during the evaluation phase.

In operation, dynamic logic gates generally cause their output signal(s) to conform to their input signal requirements. For example, a dynamic logic gate that allows low-to-high transitions during evaluation phases generally would cause its output signal(s) to be at logic low level during the precharge phase. Then, during the evaluation phase, the dynamic logic gate would cause the output signal(s) to either remain at a logic low level or transition to a logic high level, depending on the dynamic logic gate's logic operation on the input signal(s) received during the evaluation phase.

A problem arises when static flip-flops are used to drive dynamic logic gates. Conventional static flip-flops generally have uncertainty in when the flip-flops' output signals become stable. Consequently, depending on the clock rate, the time required for a conventional static flip-flop's output signals to become stable may extend into the evaluation phase of the dynamic logic gate that the static flip-flop is driving. Further, a conventional static flip-flop can, of course, provide outputs that transition in both directions (i.e., from high-to-low output voltage and low-to-high output voltage). These properties of static flip-flops can violate the requirements for driving dynamic logic gates.

One conventional solution is to operate the static flip-flop and dynamic logic gates at a slower clock rate, giving the static flip-flop adequate time to provide stable output signals to the dynamic logic gate before the dynamic logic gate enters the evaluation period. Of course, high clock speeds are desirable in most applications. Thus, this solution may not be practical for many applications. Another conventional solution is to delay the evaluation phase of the dynamic flip-flop until the static flip-flop output signals are stable, as described below in conjunction with FIG. 1.

FIG. 1 is a block diagram illustrating a circuit 100 using a conventional evaluation delay scheme. A static flip-flop 101 has an output lead 103 connected to an input lead 105 of a dynamic logic gate 107. The dynamic logic gate 107 has an output lead 108 connected to an input lead 109 of another dynamic logic gate 111. A clock signal CK is provided to a clock input terminal of the static flip-flop 101 through a clock line 115. A delay circuit 117 has an input lead 119 connected to the clock line 115, and provides at an output lead 121 a clock signal CKD, which is a delayed version of the clock signal CK. The output lead 121 of the delay circuit 117 is connected to clock input terminals of the dynamic logic gates 107 and 111. In this example, the dynamic logic gates 107 and 111 operate correctly only with stable data input signals or low-to-high transitions during the evaluation phase, and their output signals will be either stable data or low-to-high transitions during this phase.

In the conventional circuit 100, the dynamic logic gates 107 and 111 enter the evaluation phase when the clock signal CKD is high (i.e., during the logic high portion of the clock cycle) and in the precharge phase when the received clock signal is low (i.e., during the logic low portion of the clock cycle). Thus, the delay circuit 117 delays the evaluation phase of the dynamic logic gates 107 and 111 relative to the clock signal CK for a time period $\Delta$. The duration of the time period $\Delta$ is predetermined to ensure that the dynamic logic gate 107 receives a fully stable data signal (i.e., the output signal X from the static flip-flop 101) before the start of the evaluation phase and to account for clock skew and jitter between the signals CK and CKD. Of course, this delay imposes a constraint that limits the frequency of the clock signal CK, which is undesirable in most applications.

FIG. 2 is a timing diagram illustrative of the operation of the circuit 100 (FIG. 1). The waveform 201 represents the clock signal CK, which is received by the static flip-flop 101 (FIG. 1). The delay circuit 117 also receives the clock signal CK, which it delays by the time period $\Delta$ to generate the signal CKD, represented by the waveform 203. The delay circuit 117 introduces skew and jitter, as indicated by multiple-rising edges 204 of the waveform 203. For timing purposes, the maximum skew (i.e., the last rising edge 205 of the edges 204) is used in determining the speed of the circuit.

On the rising edge of the clock signal CK, the flip-flop 101 loads in a logic value received at its input terminal, and then generates an output signal X after a short propagation delay, represented by the waveform 207. Because the flip-flop 101 is a static flip-flop, the output signal X may transition from either high-to-low or low-to-high, as shown by the waveform 207.

The output signal X is received at the data input terminal of the dynamic logic gate 107 (FIG. 1). At the end of the time period $\Delta$ (measured from the rising edge of the clock signal CK), the output signal X is fully stable and the rising edge of the delayed clock signal CKD causes the dynamic logic gates 107 and 111 (FIG. 1) to enter the evaluation phase. As a result, the dynamic logic gate 107 operates on the signal X to generate an output signal Y, which is represented by the waveform 209. The output signal Y is received by the dynamic logic gate 111. In this example, the output signal Y makes a low-to-high transition during the evaluation phase, after a propagation delay incurred by the dynamic logic gate 107.

Ideally, the dynamic gate 107 would start operating on its input signal immediately upon the end of the propagation delay from the flip-flop 101. As shown in FIG. 2, the circuit 100 (FIG. 1) does not achieve this goal. The time period between the rising edge 205 and the end of the propagation delay of the static flip-flop 101 is the time penalty incurred by using the static flip-flop 101. Thus, there is a need for a flip-flop for use with dynamic logic gates that eliminates this time penalty.

SUMMARY

In accordance with the present invention, a dynamic flip-flop is provided. In one embodiment, the dynamic flip-flop includes a first latch coupled to receive a data input signal and a second latch coupled to receive the complement of the data input signal. The first and second latches have first and second shutoff circuits, respectively. During a precharge phase, the first and second latches each provide an output signal of a first logic level. During an evaluation phase, the first and second latches sample the data input signal and complemented data input signal, respectively. In response to the samples of true and the complement of the data input signal, one latch's output signal will transition to a second logic level, while the other latch's output signal remains at the first logic level.

The dynamic flip-flop also includes a first output latch and a second output latch, which are coupled to receive the output signals of the first and second latches, respectively. In this embodiment, the first and second output latches are inverting output latches. As a result, during the precharge phase, the flip-flop provides output signals of the second logic level from both of the output latches. However, during the evaluation phase, one output latch will continue to provide an output signal of the second logic level and the other output latch will provide an output signal that transitions from the second logic level to the first logic level.

More specifically, the first shutoff circuit is coupled to receive the output signal from the second latch and the second shutoff circuit is coupled to receive the output signal from the first latch. The first shutoff circuit disables the first latch in response to a transition of the output signal from the second latch. Similarly, the second shutoff circuit disables the second latch in response to a transition of the output signal from the first latch. As a result, the disabled latch causes the corresponding latch output signal to remain at the first logic level throughout the evaluation phase, even if the logic level of the data input signal changes during the evaluation phase. The output latch coupled to the non-disabled latch helps keep the non-disabled latch's output signal at the second logic level. Thus, the data input signal can only be sampled for a relatively short time interval, measured from the start of the evaluation phase to the transition of one of the latch output signals. As a result, the dynamic flip-flop is, in effect, edge-triggered, which ensures that the flip-flop's output signals will either be stable before the evaluation period or only transition from the second logic level to first logic level. Accordingly, unlike for static flip-flops, the clock signal provided to dynamic gates driven by this flip-flop need not be delayed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompany drawings, wherein.

DETAILED DESCRIPTION

Figure 1:
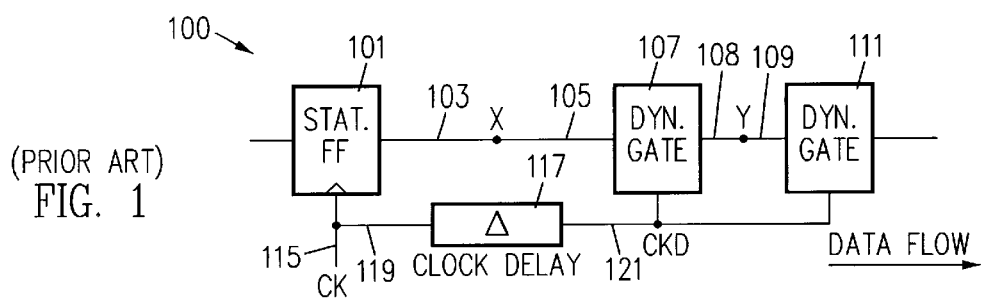
FIG 1 is a block diagram of a circuit with a conventional static flip-flop driving dynamic logic gates.
Figure 3:
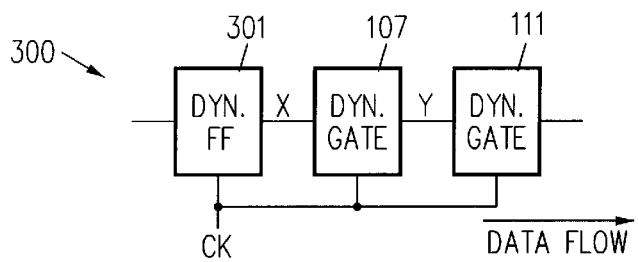
FIG. 3 is a block diagram of a circuit with a dynamic flip-flop driving dynamic logic gates.

FIG. 3 is a block diagram of a circuit 300 including a dynamic flip-flop 301 driving dynamic logic gates 107 and 111. The circuit 300 is similar to the circuit 100 (FIG. 1) except that circuit 300 omits the delay circuit 117 and uses the dynamic flip-flop 301 instead of the static flip-flop 101 (FIG. 1). The dynamic flip-flop 301 can be substantially identical to the flip-flops described below in conjunction with FIGS. 5 and 6. The dynamic flip-flop 301 provides the output signal X so that the output signal X meets the input signal requirements of the dynamic logic gates 107 and 111. More specifically, the output signal X is either stable before the evaluation phase or only transitions from low-to-high during the evaluation phase. As a result, the clock signal received the dynamic logic circuits 107 and 111 need not be delayed relative to the time the flip-flop 301 receives the clock signal, unlike conventional circuits using static flip-flops. Thus, the dynamic logic gates 107 and 111 receive the clock signal CK at approximately the same time as the dynamic flip-flop 301.

Figure 2:
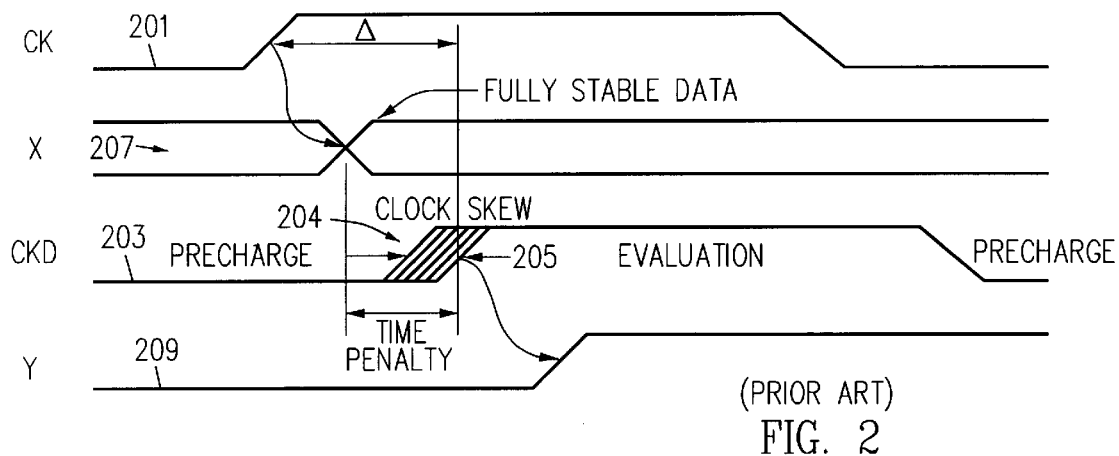
FIG. 2 is a timing diagram illustrative of the operation of the circuit depicted in FIG. 1.
Figure 4:
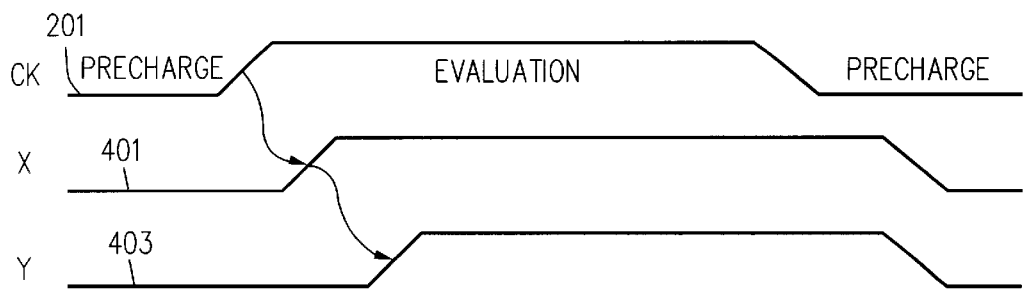
FIG. 4 is a timing diagram illustrative of the operation of the circuit depicted in FIG. 3.

FIG. 4 is a timing diagram illustrative of the operation of the circuit 300 (FIG. 3). Similar to FIG. 2, the waveform 201 represents the clock signal CK, which causes the flip-flop 301 to enter the precharge phase when at a logic low level and the evaluation phase when at a logic high level. The waveform 401 represents the output signal X provided by the dynamic flip-flop 301 (FIG. 3). In this example, the dynamic flip-flop 301 receives a logic high data input signal at the rising edge of the clock signal CK and after a relatively short propagation delay, causing the signal X to transition to a logic high level. If the data input signal was at a logic low level, the signal X would remain at a logic low level. Thus, the signal X is either stable at the logic low level or transitions from low-to-high, in keeping with the requirements of the dynamic logic gate 107.

In response to the low-to-high transition of the signal X in this example, the dynamic logic gate 107 causes the signal Y to transition from low-to-high, which is then received by the dynamic logic gate 111. Consequently, as shown in FIG. 4, the waveform 403 representing the signal Y, transitions to a logic high level after only two relatively short propagation delays after the rising edge of the clock signal CK. Of course, these two propagation delays are significantly shorter than the two propagation delays plus the time penalty (see FIG. 2) required by the conventional static flip-flop circuit 100 (FIG. 1). As a result, the clock signal CK may have a higher frequency in the circuit 300 than in the circuit 100.

Figure 5:
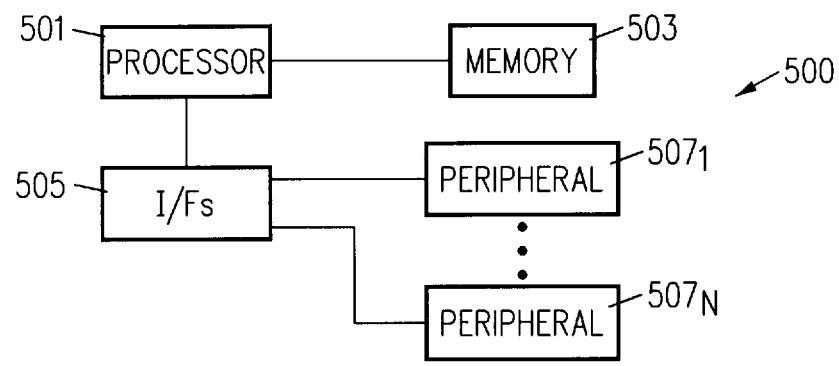
FIG. 5 is a block diagram of an electronic system that includes a dynamic flip-flop according to one embodiment of the present invention.

FIG. 5 is a block diagram of an electronic system 500 according to one embodiment of the present invention. The electronic system 500 includes an integrated circuit 501 with a dynamic flip-flop (described below in conjunction with FIGS. 6–8), a memory 503, interfaces 505 and peripherals $507_1$-$507_N$. The dynamic flip-flop is used to drive one or more dynamic logic gates in the integrated circuit 501.

The electronic system 500 can be any type of electronic system. In this embodiment, the electronic system 500 is a computer system in which the integrated circuit 501 is a processor connected to the memory 503 and to interfaces 505. The processor can be any type of processor such as, for example, X86, Sparc®, Alpha®, MIPS®, HP®, and PowerPC® processors. The interfaces 505 are connected to peripherals 507$_1$-507$_N$, thereby allowing the processor to interact with these peripherals. The memory 503 and the interfaces 505 can be any type of memory or interface for use in computer systems. Likewise, the peripherals can be any type of peripheral such as, for example, displays, mass storage devices, keyboards or any other type of input or input-output device.

In accordance with the present invention, the dynamic flip-flop in the integrated circuit 301 includes a shut-off circuit that allows the dynamic flip-flop to be edge triggered. This edge triggered feature allows the dynamic flip-flop to be advantageously used to drive dynamic logic gates without the time penalty incurred when using static flip-flops. Thus, the electronic system 500 can be operated at a faster clock rate compared to systems using static flip-flops to drive dynamic logic gates, thereby improving the performance of the system.

Figure 6:
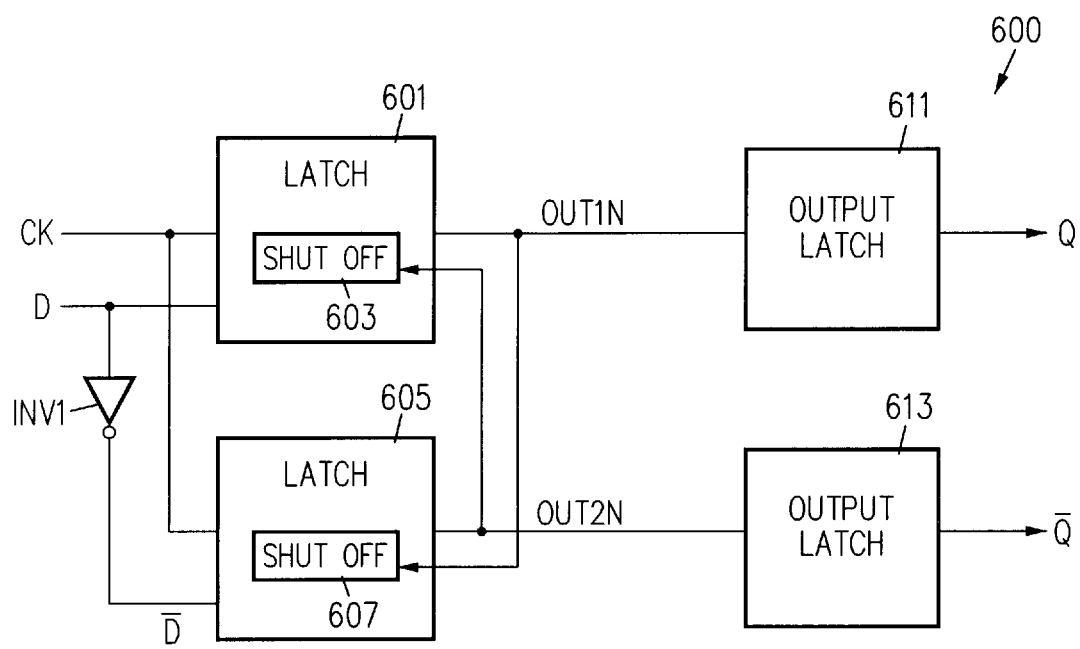
FIG. 6 is a block diagram of a dynamic flip-flop circuit according to one embodiment of the present invention.

FIG. 6 is a block diagram of a dynamic flip-flop circuit 600 according to one embodiment of the present invention. The dynamic flip-flop circuit 600 includes a input latch 601 with a shutoff circuit 603, an input latch 605 with a shutoff circuit 607 and output latches 611 and 613. The substantially identical input latches 601 and 605 are coupled to receive the clock signal CK. In addition, the input latch 601 is coupled to receive the data input signal D. In this embodiment, an inverter INV1 is also coupled to receive the data input signal D. The input latch 605 then receives the complement of the data input signal D (i.e., signal $\overline{D}$) from the inverter INV1. For applications in which the complemented data input signal $\overline{D}$ is available, other embodiments omitting the inverter INV1 may be used.

The input latch 601 provides an output signal to an input lead of the output latch 611, through an output node OUT1N. Similarly, the input latch 605 provides an output signal to an input lead of the output latch 613, through an output node OUT2N. The shutoff circuits 603 and 607 have input leads connected to the output nodes OUT2N and OUT1N, respectively. The substantially identical output latches 611 and 613 also have output leads connected to the Q and $\overline{Q}$ output terminals of the dynamic flip-flop circuit 600.

The dynamic flip-flop circuit 600 operates as follows. During the logic low portion of each cycle of the clock signal CK, the dynamic flip-flop circuit 600 is in the precharge phase. The input latches 601 and 605 precharge the logic level at the output nodes OUT1N and OUT2N to logic high levels. These logic high levels at the output nodes OUT1N and OUT2N are received by the output latches 611 and 613. The output latches 611 and 613 are inverting latches and, thus, cause both the Q and $\overline{Q}$ output signals to be at logic low levels.

On the rising edge of the clock signal CK, the dynamic flip-flop 600 enters the evaluation phase. At the beginning of the evaluation phase, the input latches 601 and 605 sample the data input signal D and the complemented data input signal $\overline{D}$, respectively. In this embodiment, the input latches 601 and 605 each output the complement of its corresponding sampled input signal. Consequently, if the data input signal D is at a logic high level, the input latch 601 will output a logic low level on the output node OUT1N and the input latch 605 will output a logic high level on the output node OUT2N. In response to the logic levels on the output nodes OUT1N and OUT2N, the output latches 611 and 613 will generate a logic high level Q output signal and a logic low level $\overline{Q}$ output signal, respectively.

In addition, in response to the logic low level on the output node OUT1N, the shutoff circuit 607 disables the input latch 605. As a result, the shutoff circuit 607 operates to prevent the input latch 605 from sampling the complemented data input signal $\overline{D}$ after the latch 607 causes the output node OUT1N transitions to a logic low level. Thus, the sampling window is approximately equal to the time needed by the input latch 601 to generate the logic low level on the output node OUT1N, plus the propagation delay of the shutoff circuit 607. This relatively short sampling window implements "edge-triggering" because the logic level is, in effect, sampled only at the rising edge of the clock signal CK. In this embodiment, after being disabled during the evaluation phase, the logic levels at the output leads of the latches 605 and 601 are maintained throughout the remainder of the evaluation phase.

In this embodiment, the input latch 601 is implemented so that once the output node OUT1N is discharged (i.e., when the input latch 601 receives a logic high level data input signal D), a subsequent high-to-low transition of the data input signal D does not cause the logic level at the output node OUT1N to change. In some other embodiments, depending on the implementation of the input latch 601, the shutoff circuit 603 can also monitor the logic level on the output node OUT1N and disable the input latch 601 in response to the logic level transitioning to a logic low level.

Conversely, if at the start of the evaluation phase the data input signal D is at a logic low level, the input latch 601 will output a logic high level on the output node OUT1N and the input latch 605 will output a logic low level on the output node OUT2N. In response to the output signals on the output nodes OUT1N and OUT2N, the output latches 611 and 613 will provide a logic low level Q output signal and a logic high level $\overline{Q}$ output signal, respectively. The logic low level at the output node OUT2N also causes the shutoff circuit 603 to disable the input latch 601, thereby helping implement the edge-triggered feature of the dynamic flip-flop circuit 600.

Figure 7:
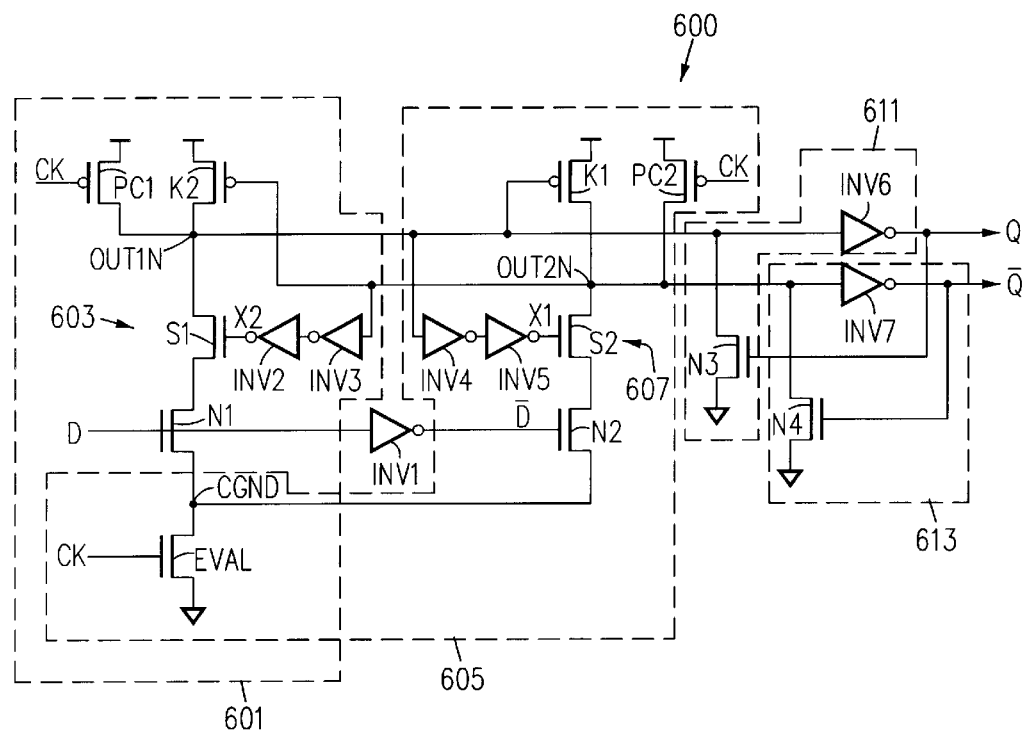
FIG. 7 is a schematic diagram of a dynamic flip-flop implementing the block diagram of FIG. 6, according to one embodiment of the present invention.

FIG. 7 is a schematic diagram of a circuit implementing the dynamic flip-flop circuit 600 (FIG. 6), according to one embodiment of the present invention. The input latch 601 includes p-channel transistors PC1 and K2, n-channel transistors S1, N1 and EVAL, and inverters INV2 and INV3. The n-channel transistor S1 and the inverters INV2 and INV3 implement the shutoff circuit 603.

The p-channel transistor PC1 has its gate coupled to receive the clock signal CK, its source coupled to a VDD voltage source (i.e, the VDD rail) and its drain connected to the output node OUT1N. The output node OUT1N is also connected to the drain of the n-channel transistor S1. The gate of the n-channel transistor S1 is coupled to the output node OUT2N through series connected inverters INV2 and INV3, where the output lead of the inverter INV2 is connected to the gate of the n-channel transistor S1, and the input lead of the inverter INV3 is connected to the output node OUT2N. The source of the n-channel transistor S2 is connected to the drain of the n-channel transistor N1. The n-channel transistor N1 has its gate coupled to receive the data input signal D, and its source connected to the drain of the n-channel transistor EVAL at the node CGND. The n-channel transistor EVAL has its gate coupled to receive the clock signal CK and its source coupled to a VSS voltage source (i.e., the VSS rail).

The input latch 605 includes p-channel transistors K1 and PC2, n-channel transistors S2 and N2, and inverters INV4 and INV5. In this embodiment, the input latch 605 shares the n-channel transistor EVAL with the input latch 601. In addition, the n-channel transistor S2 and the inverters INV4 and ISV5 implement the shutoff circuit 607. The input latch 605 is substantially identical to the input latch 601, except that the input latch 605 is implemented with the transistors PC2, K1, S2 and N2 in place of the transistors PC1, K2, S1 and N1, and with the inverters INV4 and INV5 in place of the inverters INV2 and INV3. In addition, the input latch 605 receives the complemented data input signal $\overline{Q}$ through the inverter INV1 at the gate of the n-channel transistor N2.

The output latch 611 (FIG. 6) includes an inverter INV6 and a n-channel transistor N3. The input lead of the inverter INV6 is connected to the output node OUT1N. The output lead of the inverter INV6 is connected to the Q output terminal of the dynamic flip-flop circuit 600 and the gate of the n-channel transistor N3. The n-channel transistor N3 has its source connected to the VSS voltage source, and its drain connected to the input lead of the inverter INV6.

The output latch 613 includes an inverter INV7 and a n-channel transistor N4. The input lead of the inverter INV7 is connected to the output node OUT2N. The output lead of the inverter INV7 is connected to the $\overline{Q}$ output terminal of the dynamic flip-flop circuit 600 and the gate of the n-channel transistor N4. The n-channel transistor N4 has its source connected to the VSS voltage rail, and its drain connected to the input lead of the inverter INV7.

In this embodiment, the transistors K1, K2, N3 and N4 are of the minimum size permitted by the processes used in fabricating the dynamic flip-flop circuit 600, which helps minimize the loading of the output nodes OUT1N and OUT2N.

Precharge Phase

Figure 8:
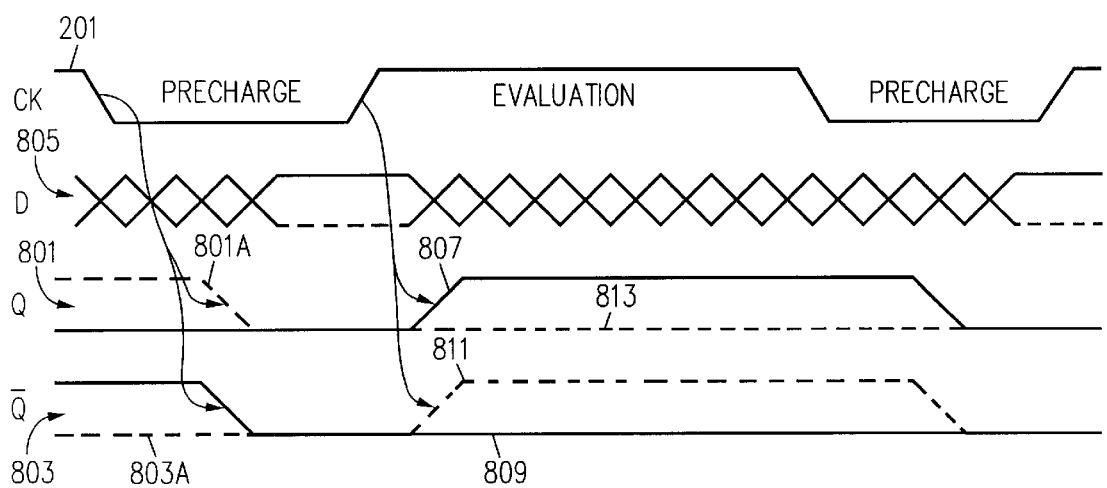
FIG. 8 is a timing diagram illustrative of the operation of the dynamic flip-flop depicted in FIG. 7.

Referring to FIGS. 7 and 8, the dynamic flip-flop circuit 600 of FIG. 7 operates as follows. When the clock signal CK is at a logic low level, the dynamic flip-flop circuit 600 is in the precharge phase, as indicated by the waveform 201. Consequently, the precharge devices (i.e., the p-channel transistors PC and PC2) are turned on and the n-channel transistor EVAL is turned off. Because the n-channel transistor EVAL is off, the p-channel transistors PC and PC2 pull up the voltage at the output nodes OUT1N and OUT2N to approximately the VDD rail voltage, thereby precharging the output nodes OUT1N and OUT2N. Consequently, the keeper devices (i.e., p-channel transistors K1 and K2) are turned off. The logic high level at the output nodes OUT1N and OUT2N cause the shutoff devices (i.e., n-channel transistors S1 and S2) to turn on, after the two inverter delays incurred by the two series connected inverters in each of shutoff circuits 603 and 607.

In addition, the logic high level at the output nodes OUT1N and OUT2N respectively propagate through the inverters INV6 and INV7, causing the Q and $\overline{Q}$ output signals to be at a logic low level during the precharge phase, as indicated by the solid line portions of the waveforms 801 and 803. The logic low Q and $\overline{Q}$ output signals cause the n-channel transistors N3 and N4 to be off. In this example, the Q output signal was at a logic low level (with the $\overline{Q}$ output signal being at a logic high level) during the previous evaluation phase. The dashed line portions 801A and 803A represent the Q and $\overline{Q}$ output signals resulting from the Q output signal being at a logic high level during the previous evaluation phase.

Evaluation Phase

When the clock signal CK transitions to a logic high level (i.e., low-to-high), the n-channel transistor EVAL is turned on, which places the dynamic flip-flop circuit 600 in the evaluation phase. The n-channel transistor EVAL pulls down the voltage at the node CGND to approximately the VSS rail voltage. In addition, the low-to-high transition of the clock signal CK also turns off the precharge devices PC1 and PC2.

The data input signal D is provided to the dynamic flip-flop circuit 600 so as to be stable before the low-to-high transition, as shown by waveform 805. The data input signal D need not be stable except at around the beginning of the evaluation phase. If the data input signal D is at a logic high level when the evaluation phase begins, the n-channel transistor N1 is turned on while the n-channel transistor N2 is turned off. Because the n-channel transistor N1 is on, the voltage at the output node OUT1N is pulled to about the VSS rail voltage through the n-channel transistors S1, N1 and EVAL. Thus, the input latch 601 provides a logic low output signal at the output node OUT1N, which turns on the p-channel transistor K1 to help keep the voltage at the output node OUT2N at a logic high level. The logic low level at the output node OUT1N also propagates through the inverter INV6. As a result, the Q output signal transitions from low-to-high, as shown by portion 807 of the waveform 801. The logic high level of the Q output signal turns on the n-channel transistor N3, which helps to further pull down the voltage at the output node OUT1N.

The logic low level at the output node OUT1N also propagates through the inverters INV4 and INV5, resulting in the gate voltage X1 of the n-channel transistor S2 being driven to a logic low level. Consequently, the shutoff device S2 is turned off. As a result, the input latch 605 is disabled from sampling the voltage of the complemented data input signal $\overline{D}$. Because the n-channel transistor S2 is off, the input latch 605 now cannot discharge the output node OUT2N even if the data input signal D were to subsequently transition to a logic low level during this evaluation phase. Thus, the $\overline{Q}$ output signal remains at a logic low level, as indicated by the portion 809 of the waveform 803. Further, if the data input signal D were to transition to a logic low level after the output node OUT1N was discharged, the n-channel transistor N1 would be turned off, but the n-channel transistor N3 keeps the voltage at the output node OUT1N at a logic low level.

The two stage design of the dynamic flip-flop circuit 600 greatly increases the speed of the flip-flop circuit compared to conventional static flip-flop designs. For example, a typical master-slave static flip-flop has master input stage, master output stage, slave input stage and slave output stage. Consequently, the dynamic flip-flop circuit 600 is generally about twice as fast as a conventional static flip-flop. The forward delay of the dynamic flip-flop circuit 600 (i.e., the lead edge of the clock signal CK to the Q output signal) is approximately equal to the time needed to pull down the voltage at the output node OUT1N from the precharge voltage, plus one inverter delay (from the inverter INV6). In a further refinement, the inverter INV6 can be designed to perform low-to-high transitions more quickly to further reduce this forward delay. For example, the inverter INV6 can be designed with a larger p-channel device. Although the larger p-channel device in the inverter INV6 will cause the high-to-low transition to be slower, this effect is not critical because such transitions only occur in the precharge phase.

The two inverters INV4 and INV5 help minimize the forward delay of the dynamic flip-flop circuit 600 by reducing the load on the output node OUT1N, compared to an embodiment in which the gate of the shutoff device S2 is connected to the output node OUT1N. The capacitive load of the inverter INV4 is significantly smaller than the gate capacitance of the shutoff device S2, thereby advantageously allowing the n-channel pulldown stack (i.e., transistors S2, N2 and EVAL) to be smaller while still achieving a speed increase in the discharge of the output node OUT1N due to the smaller load. This size and speed advantage is achieved at the expense of a slight increase in the hold time of the dynamic flip-flop circuit 600 due to the delays from the inverters INV4 and INV5.

In addition, the shutoff operation provides good noise immunity across supply voltage, temperature and process variations. For example, if the VDD rail voltage increases (which makes input noise more severe), the sampling window is decreased because the higher VDD voltage increases the speed of the shutoff circuit 607. The decreased sampling window offsets the increased input noise, thereby causing the noise immunity to be substantially constant over supply voltage variations. Similarly, process and temperature changes that tend to increase noise also tend to speed up the shutoff circuit 607, resulting in a decreased sampling window to offset the increased noise. Moreover, because the shutoff circuit 607 is triggered by high-to-low transitions of the voltage on the output node OUT1N, the clock signal CK is not used to drive the shutoff device S2, which advantageously reduces clock line loading. Thus, a less complex clock distribution network can be used in applications using dynamic flip-flops according to this embodiment of the present invention.

The input latch 601 and the output latch 61 are substantially symmetrical to the input latch 605 and the output latch 613 in structure, interconnection and function. Consequently, those skilled in the art of flip-flop circuits will appreciate that the above description of when the data input signal D is at a logic high level at the start of the evaluation phase applies in a symmetrical manner to the evaluation phase operation when the data input signal D is at a logic low level at the start of the evaluation phase. Accordingly, only a brief description is needed of the evaluation phase operation when the data input signal D is at a logic low level.

If the data input signal is at a logic low level when the evaluation phase begins, the n-channel transistors S2, N2, and EVAL are turned on, thereby discharging the output node OUT2N. The logic low level of the output node OUT2N causes the output latch 613 to output a logic high level, as indicated by the dashed portion 811 of the waveform 803. The logic low voltage at the output node OUT2N propagates through the inverters INV3 and INV2, thereby causing the gate voltage X2 to be at a logic low level. This logic low gate voltage X2 turns off the shutoff device S2, thereby disabling the input latch 601. The logic low level of the output node OUT2N also turns on the keeper device K2, which helps keep the Q output signal at a logic low level, as indicated by the dashed line portion 813 of the waveform 801. If the data input signal D subsequently transitions to a logic high level during this evaluation phase, the disabled input latch 601 cannot not change the voltage at the output node OUT1N.

The embodiments of the dynamic flip-flop described above are illustrative of the principles of this invention and are not intended to limit the invention to the particular embodiments described. For example, those skilled in the art of flip-flops can implement an NMOS (or other transistor technology) embodiment in view of this disclosure without undue experimentation. Those skilled in the art of flip-flops can also implement a "complementary" embodiment, in which the dynamic flip-flop circuit has "series" p-channel devices and n-channel "hold" devices. Further, relatively simple logic functions can be placed inside the dynamic flip-flop circuit in other embodiments. Thus, for example, a three-input multiplexer or an exclusive-OR logic function can be implemented. Accordingly, while the preferred embodiment of the invention has been illustrated and described, it will be appreciated that in view of the present disclosure, various changes can be made therein without departing from the spirit and scope of the invention.

The embodiments of the invention in which an exclusive property or privilege is claimed are defined as follows:

1. A circuit capable of operating in a first phase and a second phase, said circuit comprising:
   a first latch having a first input lead, a second input lead and an output lead, said first latch including a first shutoff circuit, wherein
   said first input lead of said first latch is coupled to receive a first signal,
   said second input lead of said first latch is coupled to receive a second signal, and
   said first latch is operative to output a signal of a first logic level at said output lead of said first latch during said first phase;
   a second latch having an input lead and an output lead, said second latch including a second shutoff circuit, wherein
   said second latch is operative to output a signal of said first logic level at said output lead of said second latch during said first phase,
   said first input lead of said second latch is coupled to receive said first signal, and
   said second input lead of said second latch is coupled to receive a complement of said second signal;
   a first output latch having an input lead and an output lead, said input lead of said first output latch coupled to said output lead of said first latch; and
   a second output latch having an input lead and an output lead, said input lead of said second output latch coupled to said output lead of said second latch.

2. The circuit of claim 1 wherein said first latch is operative to sample a logic level at said second input lead of said first latch when said second signal is at a second logic level during said second phase.

3. The circuit of claim 2 wherein said second latch is operative to sample a logic level at said second input lead of said second latch when said second signal is at said second logic level during said second phase.

4. The circuit of claim 2 wherein said first shutoff circuit is operative to cause said first latch to stop sampling said logic level at said second input lead of said first latch.

5. The circuit of claim 4 wherein said first signal is a clock signal, each edge of said clock signal defining a transition between said first phase and said second phase.

6. The circuit of claim 5 wherein said first latch is operative to sample said logic level at said second input lead of said first latch beginning at a transition from said first phase to said second phase.

7. The circuit of claim 4 wherein said first shutoff circuit does not receive said clock signal, whereby said first shutoff circuit does not increase capacitive loading of said clock signal.

8. The circuit of claim 1 wherein said first shutoff circuit is coupled to said output lead of said second latch.

9. The circuit of claim 8 wherein said first shutoff circuit is operative to cause said first latch to stop sampling said logic level at said second input lead of said first latch in response to said second latch outputting a signal of said second logic level at said output lead of said second latch.

10. The circuit of claim 9 wherein said first shutoff circuit of said first latch comprises:
    a first inverter having an input lead coupled to said output lead of said second latch;

a second inverter having an input lead coupled to an output lead of said first inverter; and a first transistor having a first lead coupled to an output lead of said second inverter and a second lead coupled to said output lead of said first latch.

11. The circuit of claim 10 wherein said first latch further comprises:

a second transistor having a first lead coupled to receive said first signal, a second lead coupled to a first voltage source and a third lead coupled to said output lead of said first latch;

a third transistor having a first lead coupled to receive said second signal and a second lead coupled to a third lead of said first transistor; and a fourth transistor having a first lead coupled to receive said first signal, a second lead coupled to a second voltage source, and a third lead coupled to a third lead of said third transistor.

12. The circuit of claim 11 wherein said second transistor is operative to be conductive when said fourth transistor is substantially non-conductive.

13. The circuit of claim 12 wherein said first latch further comprises a fifth transistor having a first lead coupled to said output lead of said second latch, a second lead coupled to said first voltage source, and a third lead coupled to said output lead of said first latch.

14. The circuit of claim 12 wherein said second latch comprises said fourth transistor.

15. The circuit of claim 2 wherein said second output latch comprises:

a third inverter having an input lead coupled to said output lead of said second latch; and a sixth transistor having a first lead coupled to an output lead of said third inverter, a second lead coupled to said input lead of said third inverter, and a third lead coupled to said second voltage source.

16. A method for implementing a flip-flop, said method comprising:

providing a first output signal of a first logic level during a first phase of operation;

providing a second output signal of said first logic level during said first phase of operation;

sampling an input signal at about a transition from said first phase of operation to a second phase of operation;

providing said first output signal with a second logic level in response to said sampling of said input signal; and disabling said sampling of said input signal in response to providing said first output signal with said second logic level.

17. A computer system comprising:

a processor;

a memory coupled to said processor;

an interface coupled to said processor; and a peripheral coupled to said interface, wherein said processor includes a circuit capable of operating in a first phase and a second phase, said circuit comprising:

a first latch having a first input lead, a second input lead and an output lead, said first latch including a first shutoff circuit, wherein said first input lead of said first latch is coupled to receive a first signal, said second input lead of said first latch is coupled to receive a second signal, and said first latch is operative to output a signal of a first logic level at said output lead of said first latch during said first phase;

a second latch having an input lead and an output lead, said second latch including a second shutoff circuit, wherein said second latch is operative to output a signal of said first logic level at said output lead of said second latch during said first phase, said first input lead of said second latch is coupled to receive said first signal, and said second input lead of said second latch is coupled to receive a complement of said second signal;

a first output latch having an input lead and an output lead, said input lead of said first output latch coupled to said output lead of said first latch; and a second output latch having an input lead and an output lead, said input lead of said second output latch coupled to said output lead of said second latch.

18. The circuit of claim 17 wherein said first latch is operative to sample a logic level at said second input lead of said first latch when said second signal is at a second logic level during said second phase.

19. The circuit of claim 18 wherein said second latch is operative to sample a logic level at said second input lead of said second latch when said second signal is at said second logic level during said second phase.

20. The circuit of claim 18 wherein said first shutoff circuit is operative to cause said first latch to stop sampling said logic level at said second input lead of said first latch.

* * * * *